US008039779B2

(12) United States Patent
Yato (10) Patent No.: US 8,039,779 B2
(45) Date of Patent: Oct. 18, 2011

(54) ELECTRONIC DEVICE

(75) Inventor: Shinsuke Yato, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 204 days.

(21) Appl. No.: 12/556,392

(22) Filed: Sep. 9, 2009

(65) Prior Publication Data
US 2010/0156508 A1 Jun. 24, 2010

(51) Int. Cl.
*H04N 5/64* (2006.01)
(52) U.S. Cl. ........... 250/205; 348/836; 359/457; 349/58
(58) Field of Classification Search ............ 250/205, 250/239; 348/836, 789, 818; 359/457; 349/58
See application file for complete search history.

(56) References Cited

U.S. PATENT DOCUMENTS

| | | | | | |
|---|---|---|---|---|---|
| 5,914,809 | A | * | 6/1999 | Mitani et al. ................. | 359/457 |
| 6,137,548 | A | * | 10/2000 | Uchida et al. ................ | 348/818 |
| 6,157,416 | A | * | 12/2000 | Whitelaw et al. ............ | 348/789 |
| 6,377,320 | B1 | * | 4/2002 | Ananian et al. .............. | 348/836 |
| 7,327,407 | B2 | | 2/2008 | Huber | |
| 7,929,280 | B2 | * | 4/2011 | Choi .............................. | 349/58 |

FOREIGN PATENT DOCUMENTS

| | | |
|---|---|---|
| JP | 03-182480 A | 8/1991 |
| JP | 05-147842 A | 6/1993 |
| JP | 2004-079381 | 3/2004 |
| JP | 2006-128019 A | 5/2006 |
| JP | 2007-015490 | 1/2007 |
| JP | 2007-015490 A | 1/2007 |
| JP | 2007-018811 A | 1/2007 |
| JP | 2007-149610 | 6/2007 |
| JP | 2007-149610 A | 6/2007 |
| JP | 2008-177119 A | 7/2008 |

OTHER PUBLICATIONS

Notice of Rejection mailed by Japan Patent Office on Jan. 12, 2010 in the corresponding Japanese patent application No. 2008-328523.
Notice of Rejection mailed by Japan Patent Office on Jun. 15, 2010 in the corresponding Japanese patent application No. 2008-328523.
Explanation of Non-English Language Reference(s).
Decision of a Patent Grant mailed by Japan Patent Office on Nov. 16, 2010 in the corresponding Japanese patent application No. 2008-328523.
Notification of Rejection mailed by Japanese Patent Office on Jun. 7, 2011 in a corresponding Japanese patent application No. 2011-089251 in 5 pages.

* cited by examiner

*Primary Examiner* — Seung C Sohn
(74) *Attorney, Agent, or Firm* — Knobbe, Martens, Olson & Bear, LLP (57) ABSTRACT

According to one embodiment, an electronic device includes a housing, an operation area, at least one display, an input detector, a light source device, and a controller. The operation area is provided on an outer surface of the housing. The display is located in the operation area, and includes a first indicator and a second indicator made of a light transmissive material. The first indicator corresponds to a design that indicates operation content, while the second indicator is located in a position not covered by an operation tool with which operation is performed on the first indicator and indicates operation state. The input detector faces the operation area in the housing and detects electrostatic capacitance in the operation area. The light source device emits light to the display in the operation area. The controller controls the light source device based on a variation in electrostatic capacitance detected by the input detector to turn on or off at least the second indicator.

10 Claims, 6 Drawing Sheets

|  | TRANSMISSIVE AREA 1 | TRANSMISSIVE AREA 3 |
|---|---|---|
| UNTOUCHED | LIT UP | NOT LIT UP |
| TOUCHED | NOT LIT UP | LIT UP |

FIG.8

|  | TRANSMISSIVE AREA 1 | TRANSMISSIVE AREA 3 |
|---|---|---|
| UNTOUCHED | LIT UP | LIT UP |
| TOUCHED | LIT UP | NOT LIT UP |

|  | TRANSMISSIVE AREA 1 | TRANSMISSIVE AREA 3 |
|---|---|---|
| UNTOUCHED | LIT UP | LIT UP |
| TOUCHED | NOT LIT UP | NOT LIT UP |

US 8,039,779 B2

ELECTRONIC DEVICE

CROSS-REFERENCE TO RELATED APPLICATIONS

This application is based upon and claims the benefit of priority from Japanese Patent Application No. 2008-328523, filed Dec. 24, 2008, the entire contents of which are incorporated herein by reference.

BACKGROUND

1. Field

One embodiment of the invention relates to an electronic device.

2. Description of the Related Art

In recent years, there has been increasing use of switches (touch sensor switches) that are provided with an indicator (generally, a design referred to as a switch) on its surface for notifying the user of the operation position and operation state and a capacitance sensor for detecting operation on the indicator. Reference may be had to, for example, Japanese Patent Application Publication (KOKAI) No. 2007-15490. The indicator of such a touch sensor switch is formed of a light transmissive resin or the like. The touch sensor switch turns on/off the indicator by controlling the light source thereof such as a light-emitting diode (LED) to notify the user of the operation state.

The touch sensor switch is often used for electronic devices such as portable computers, mobile phones, remote controllers, and the like.

As described above, the touch sensor switch notifies the user of the operation position by lighting up the indicator through control of the light source thereof such as LED. In practice, however, the indicator is substantially covered by a fingertip of the user who is operating the touch sensor switch. Accordingly, while pressing the touch sensor switch, the user cannot determine whether the indicator is ON or OFF, which indicates that the user has operated the touch sensor switch correctly.

BRIEF DESCRIPTION OF THE SEVERAL VIEWS OF THE DRAWINGS

A general architecture that implements the various features of the invention will now be described with reference to the drawings. The drawings and the associated descriptions are provided to illustrate embodiments of the invention and not to limit the scope of the invention.

DETAILED DESCRIPTION

Various embodiments according to the invention will be described hereinafter with reference to the accompanying drawings. In general, according to one embodiment of the invention, an electronic device comprises a housing, an operation area, at least one display, an input detector, a light source device, and a controller. The operation area is located on an outer surface of the housing. The display in the operation area is configured to include a first indicator and a second indicator made of a light transmissive material. The first indicator corresponds to a design that indicates operation content, and the second indicator is located in a position not covered by an operation tool with which operation is performed on the first indicator and indicates operation state. The input detector is configured to face the operation area in the housing and detect electrostatic capacitance in the operation area. The light source device is configured to emit light to the display in the operation area. The controller is configured to control the light source device based on a variation in electrostatic capacitance detected by the input detector to turn on or off at least the second indicator.

With reference to FIGS. 1 to 8, a description will be given of a configuration of an electronic device according to a first embodiment of the invention. In the following, the electronic device will be described as a portable computer by way of example and without limitation.

Figure 1:
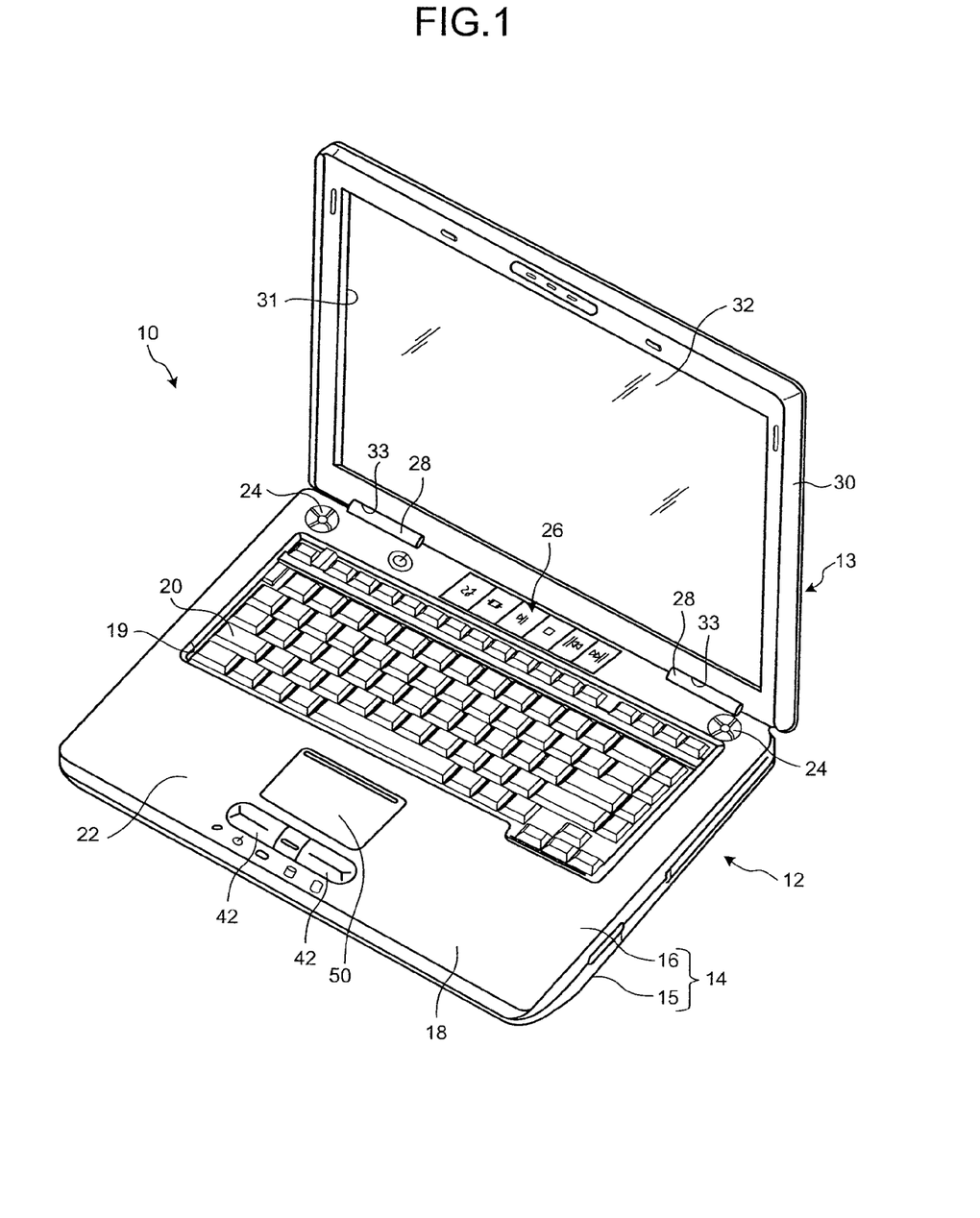
FIG. 1 is an exemplary perspective view of a notebook portable computer according to a first embodiment of the invention.

FIG. 1 is a perspective view of a notebook portable computer 10 according to the first embodiment. As illustrated in FIG. 1, the portable computer 10 comprises a main body 12 and a display module 13 supported by the main body 12. The main body 12 comprises a housing 14. The housing 14 comprises a rectangular base 15 and a substantially rectangular cover 16. The cover 16 is fitted on the base 15 to form the housing 14 in a flat box shape.

The cover 16 that constitutes the housing 14 is made of a light transmissive resin such as acrylic resin. A surface of the cover 16 is covered with a surface layer (a light shielding film) 18 having a light shielding property. As will be described later, the surface layer 18 is formed so that part thereof is transparent and allows light to pass therethrough.

A substantially rectangular opening 19 is formed from the center to back side of the cover 16. A keyboard 20 is fitted in the opening 19 to be exposed to the outside. Meanwhile, on the front side (user side) of the cover 16 is formed a palm rest 22 on which the user rests his/her hands. To the center of the palm rest 22 is provided an operation area 50 and click switches 42 for operating a pointing device.

A pair of speakers 24 is provided on the display module 13 side of the cover 16. An operation area 26 is arranged between the speakers 24. In addition, a pair of legs 28 is provided on the display module 13 side of the cover 16. The legs 28 are spaced apart in the width direction of the housing 14.

The display module 13 comprises a display housing 30 and a liquid crystal display (LCD) panel 32 housed in the display housing 30. On the front wall of the display housing 30 is formed a window 31 for display. The window 31 occupies the most area of the front wall of the display housing 30. The display screen of the LCD panel 32 is exposed to the outside of the display housing 30 through the window 31.

The display housing 30 comprises a pair of connection recesses 33 on an edge thereof. The recesses 33 are spaced apart in the width direction of the display housing 30, and are engaged with the legs 28 of the housing 14, respectively. The display housing 30 is supported by the recesses 33 and hinges (not illustrated) provided respectively to the legs 28 so that it can rotate with respect to the housing 14.

This configuration allows the display module 13 to rotate between a closed position and an open position. The display module 13 lies and covers over the upper surface of the housing 14 including the palm rest 22 and the keyboard 20 in the closed position, while it stands to expose the upper surface of the housing 14 and the LCD panel 32 in the open position. Incidentally, FIG. 1 illustrates the portable computer 10, the display module 13 of which is located in the open position.

Although not illustrated in the drawings, the housing 14 comprises, in the inside, a printed circuit board as a main control device provided with a hard disk drive (HDD), an optical disk drive, a central processing unit (CPU), and the like.

A description will now be given of the function of lighting up an operation button in the operation area 26 as a salient feature of the portable computer 10 of the first embodiment.

Figure 2:
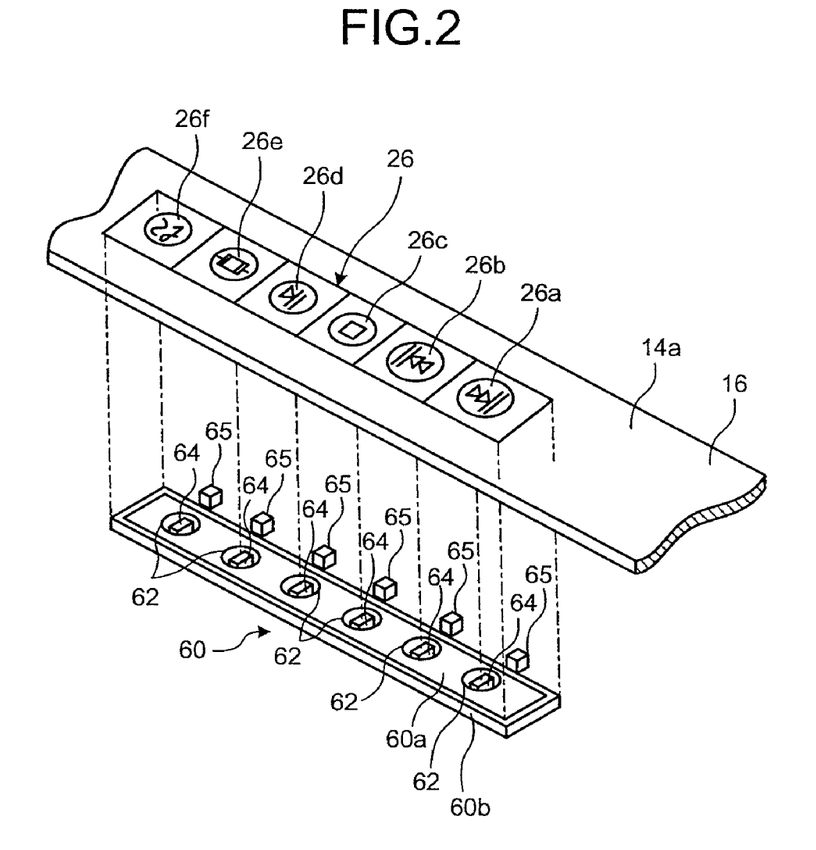
FIG. 2 is an exemplary exploded perspective view of an operation area and around the area in the first embodiment.

FIG. 2 is an exploded perspective view of the operation area 26 and the surrounding thereof. As has already been described, the operation area 26 is provided on the display module 13 side of the cover 16. As illustrated in FIG. 2, the operation area 26 comprises operation buttons such as a fast forward button 26a, a rewind button 26b, a stop button 26c, a pause button 26d, an application start button 26e, and a mute button 26f, which are used for video display operation. The operation area 26 is formed in a rectangular shape. As a display, the operation buttons 26a to 26f are arranged along an edge of the operation area 26 in the shape of a strip.

Figure 3:
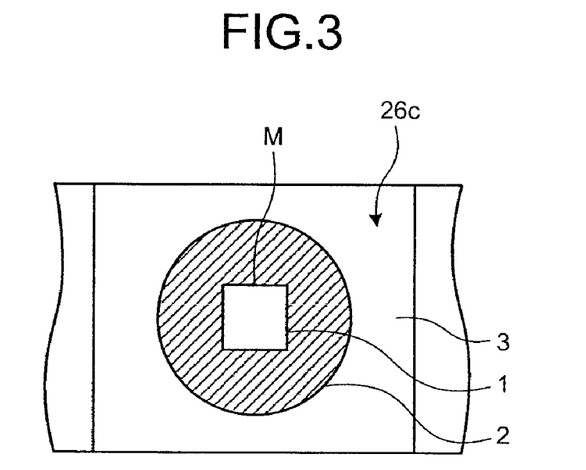
FIG. 3 is an exemplary plan view of a stop button in the first embodiment.

The operation buttons 26a to 26f in the operation area 26 are each provided with a corresponding mark. FIG. 3 is a plan view of an example of the stop button 26c. As illustrated in FIG. 3, the stop button 26c has a rectangular mark M, which is a typical design indicating the operation content or function of the stop button 26c. Such a mark corresponds to a transmissive area 1 (a first indicator) formed of part of the surface layer 18 that covers an outer surface of the cover 16. The part of the surface layer 18 is transparent and allows light to pass therethrough. Each of the operation buttons 26a to 26f may be transparent and colorless or colored. The operation buttons 26a to 26f each further comprise a non-transmissive area 2 and a transmissive area 3 (a second indicator). The non-transmissive area 2 is formed around the transmissive area 1. The non-transmissive area 2 has about the same diameter as that of user's fingertip and does not allow light to pass therethrough. The transmissive area 3 is formed around the non-transmissive area 2 such that it allows light to pass therethrough. More specifically, the transmissive area 3 (the second indicator) is arranged in a position that is not covered by an operation tool, such as a finger of the user, with which the user operates the transmissive area 1 (the first indicator), and indicates the state of operation by the user. The transmissive area 3 is also formed of the part of the surface layer 18, which is transparent and allows light to pass therethrough.

Besides, as illustrated in FIG. 2, a touch sensor 60 is provided at a position that faces the operation area 26 inside the cover 16. The touch sensor 60 is an input detector that detects input provided through the operation area 26. The touch sensor 60 comprises an elongated rectangular input sheet 60a corresponding to the size of the entire operation area 26 and a printed board 60b that forms a driver. The printed board 60b is formed in an elongated rectangular shape corresponding to the size of the input sheet 60a. The input sheet 60a may be, for example, a capacitance sensor sheet that detects electrostatic capacitance, and is attached to a surface of the printed board 60b. The touch sensor 60 is electrically connected to the printed circuit board serving as a main control device.

In the input sheet 60a and the printed board 60b, circular holes 62 are formed at positions corresponding to the operation buttons 26a to 26f, respectively. The holes 62 each have a diameter smaller than that of user's fingertip. The holes 62 are provided with LEDs 64, respectively, inside them. The LEDs 64 function as a first light source and are electrically connected to the printed board 60b. The LEDs 64 are arranged to face the operation buttons 26a to 26f, respectively, and emit light to the transmissive area 1 of the operation buttons 26a to 26f from the inside of the cover 16.

Figure 4:
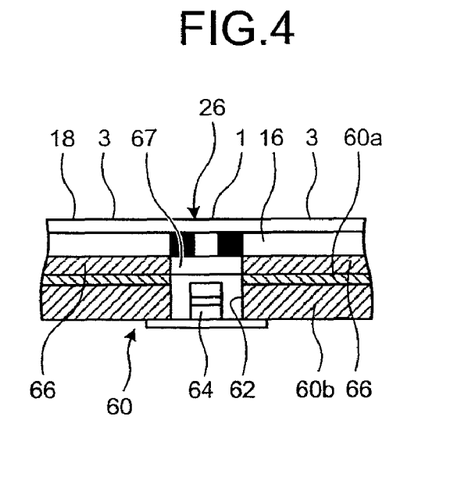
FIG. 4 is an exemplary cross-sectional view of the stop button in the first embodiment.

In addition, LEDs 65 are arranged at positions near the holes 62, respectively, along the longitudinal edge of the touch sensor 60. The LEDs 65 function as a second light source and are electrically connected to the printed board 60b. Further, as illustrated in FIG. 4, a light guide plate 66 is arranged at a position facing the LEDs 65 between the cover 16 and the input sheet 60a. The light guide plate 66 faces the transmissive area 3. As can be seen from FIG. 4, in the light guide plate 66, circular holes 67 are also formed at positions corresponding to the operation buttons 26a to 26f, respectively. Even if the light guide plate 66 is interposed between the cover 16 and the input sheet 60a in this manner, the sensor sensitivity does not reduce. With this configuration, the LEDs 65 emit light to the transmissive area 3 of the operation buttons 26a to 26f from the inside of the cover 16 through the light guide plate 66.

That is, the LEDs 64 as the first light source and the LEDs 65 as the second light source constitute a light source device.

Figure 5:
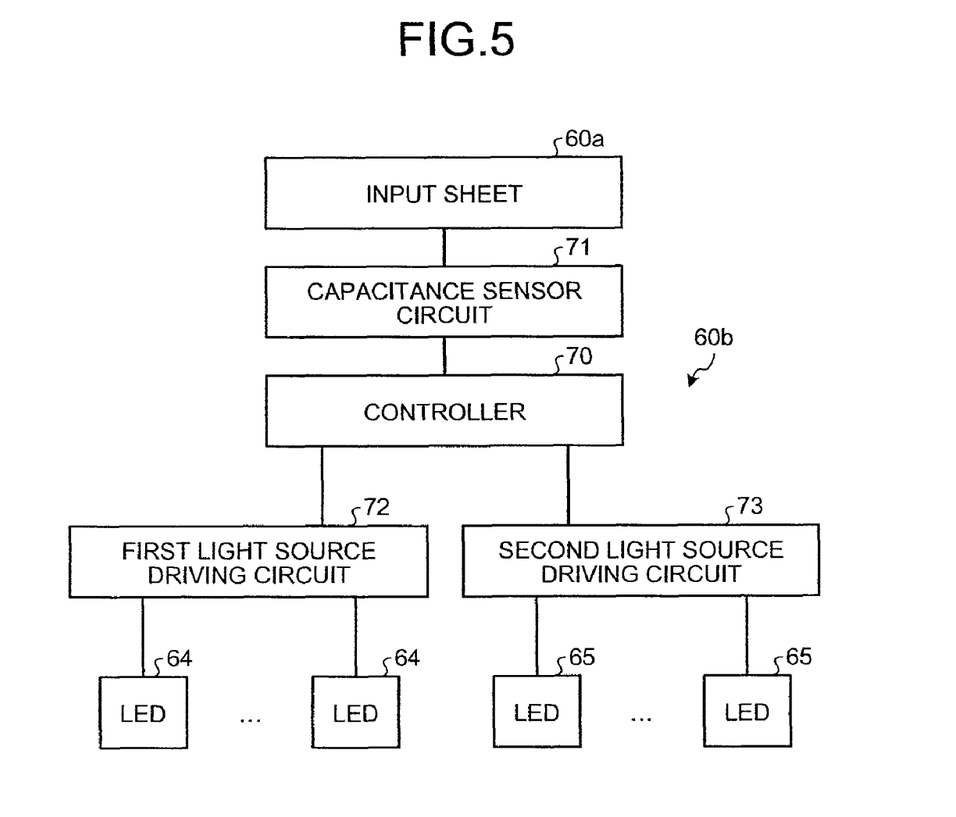
FIG. 5 is an exemplary block diagram of a control system provided to a printed board in the first embodiment.

In the following, a description will be given of a control system that is provided to the printed board 60b and that controls turning on/off the LEDs 64 and the LEDs 65. FIG. 5 is a block diagram of the control system provided to the printed board 60b. As illustrated in FIG. 5, the printed board 60b comprises a controller 70 provided with CPU as a main controller and the like. A capacitance sensor circuit 71, a first light source driving circuit 72, and a second light source driving circuit 73 are connected via a control signal to the controller 70.

The capacitance sensor circuit 71 is connected to the input sheet 60a and outputs electrostatic capacitance detected by the input sheet 60a. More specifically, the capacitance sensor circuit 71 generates a detection signal, the duty ratio of which varies according to the electrostatic capacitance detected by the input sheet 60a, and outputs the detection signal to the controller 70.

The first light source driving circuit 72 is connected to the LEDs 64 and turns on/off each of the LEDs 64 in response to a control signal received from the controller 70.

The second light source driving circuit 73 is connected to the LEDs 65 and turns on/off each of the LEDs 65 in response to a control signal received from the controller 70.

Figure 6:
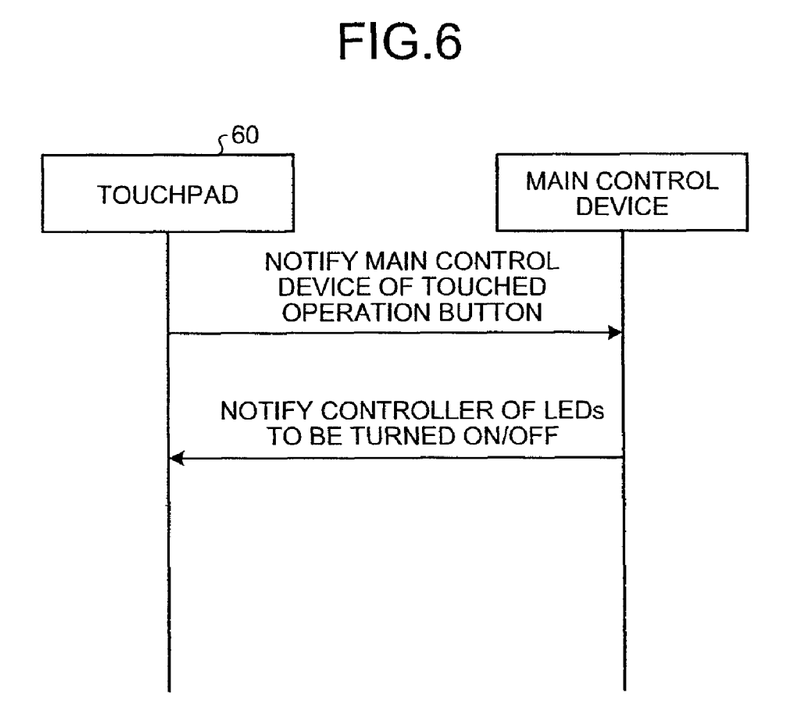
FIG. 6 is an exemplary sequence diagram of the operation of the control system in the first embodiment.

With reference to FIG. 6, a description will now be given of how to control the lighting up of the operation buttons 26a to 26f in the operation area 26 configured as above.

When the user touches anyone of the operation buttons 26a to 26f in the operation area 26 from the outside of the cover 16, the input sheet 60a of the touch sensor 60 detects the touch. According to a detection signal output from the capacitance sensor circuit 71, the controller 70 of the printed board 60b determines the operation button touched by the user, and notifies the main control device of the detection result.

Figure 7:
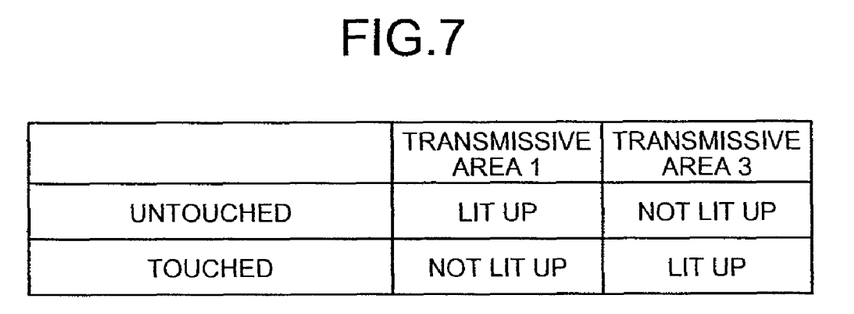
FIG. 7 is an exemplary schematic diagram of a light control table in the first embodiment.

Upon receipt of the notification, the main control device determines which of the LEDs 64 and the LEDs 65 is to be turned on and which of them is to be turned off based on a light control table. Thereafter, the main control device notifies the controller 70 of the printed board 60b of the determination result. FIG. 7 illustrates an example of the light control table. In the example of FIG. 7, when the operation buttons 26a to 26f are not touched, the LEDs 64 are controlled so that the transmissive area 1 (i.e., the mark) of all the operation buttons 26a to 26f is lit up, and the LEDs 65 are controlled so that the transmissive area 3 of all the operation buttons 26a to 26f is not lit up. When any one of the operation buttons 26a to 26f is touched, the LEDs 64 are controlled so that the transmissive area 1 (i.e., the mark) of the operation button is not lit up, and the LEDs 65 are controlled so that the transmissive area 3 of the operation button is lit up.

In this manner, the transmissive area 3 of each operation button functions as an indicator indicating whether the operation button is touched. Accordingly, even if the transmissive area 1 (i.e., the mark) of the operation buttons 26a to 26f is covered by an operation tool such as a finger of the user, a touch on each operation button can be visually recognized. This improves the operability and convenience.

As described above, according to the first embodiment, at least one operation button (the operation buttons 26a to 26f) is arranged in the operation area 26 provided outside the housing 14. Each of the operation buttons 26a to 26f comprises the transmissive area 1 and the transmissive area 3. The transmissive area 1 corresponds to a mark which is a design indicating the operation content or function of the operation button. The transmissive area 3 is arranged in a position that is not covered by an operation tool with which the user operates the transmissive area 1, and indicates the state of operation by the user. The transmissive areas 1 and 3 are made of a light transmissive material and are located on the surface of the cover 16. According to a variation in electrostatic capacitance detected by the touch sensor 60, a light source device (the LEDs 64 and 65) is turned on/off to control the lighting up of the transmissive areas 1 and 3. In other words, even if the transmissive area 1 is covered by a fingertip of the user and the user cannot determine whether the transmissive area 1 is lit up, the user can determine the operation state through the transmissive area 3 arranged in a position that is not covered by an operation tool of the user with which the user operates the transmissive area 1. In other words, according to a variation in electrostatic capacitance detected by the touch sensor 60, the light source device (the LEDs 64 and 65) is turned on/off to control the lighting up of the transmissive area 3. Thus, the user can visually recognize the operation state. This improves the operability and convenience.

Figure 8:
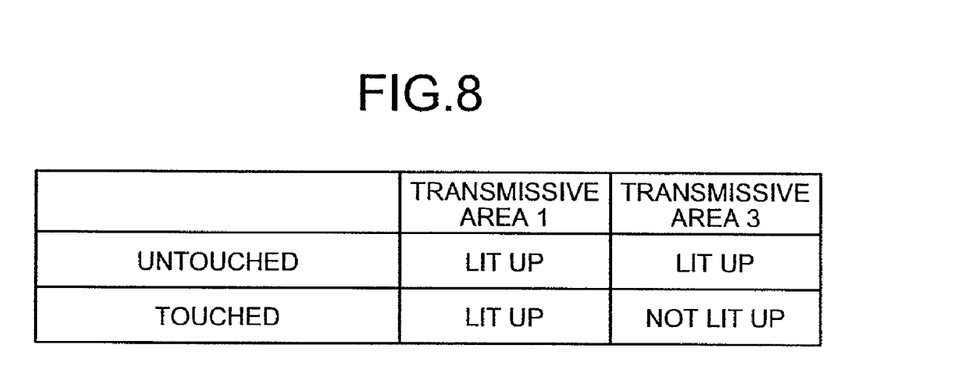
FIG. 8 is another exemplary schematic diagram of a light control table in the first embodiment.

Incidentally, the light control table is not limited to the one illustrated in FIG. 7, but may be the one as illustrated in FIG. 8. In the example of FIG. 8, when the operation buttons 26a to 26f are not touched, the LEDs 64 are controlled so that the transmissive area 1 (i.e., the mark) of all the operation buttons 26a to 26f is lit up, and also the LEDs 65 are controlled so that the transmissive area 3 of all the operation buttons 26a to 26f is lit up. When any one of the operation buttons 26a to 26f is touched, the LEDs 64 are controlled so that the transmissive area 1 (i.e., the mark) of the operation button is lit up, and the LEDs 65 are controlled so that the transmissive area 3 of the operation button is not lit up.

Figure 9:
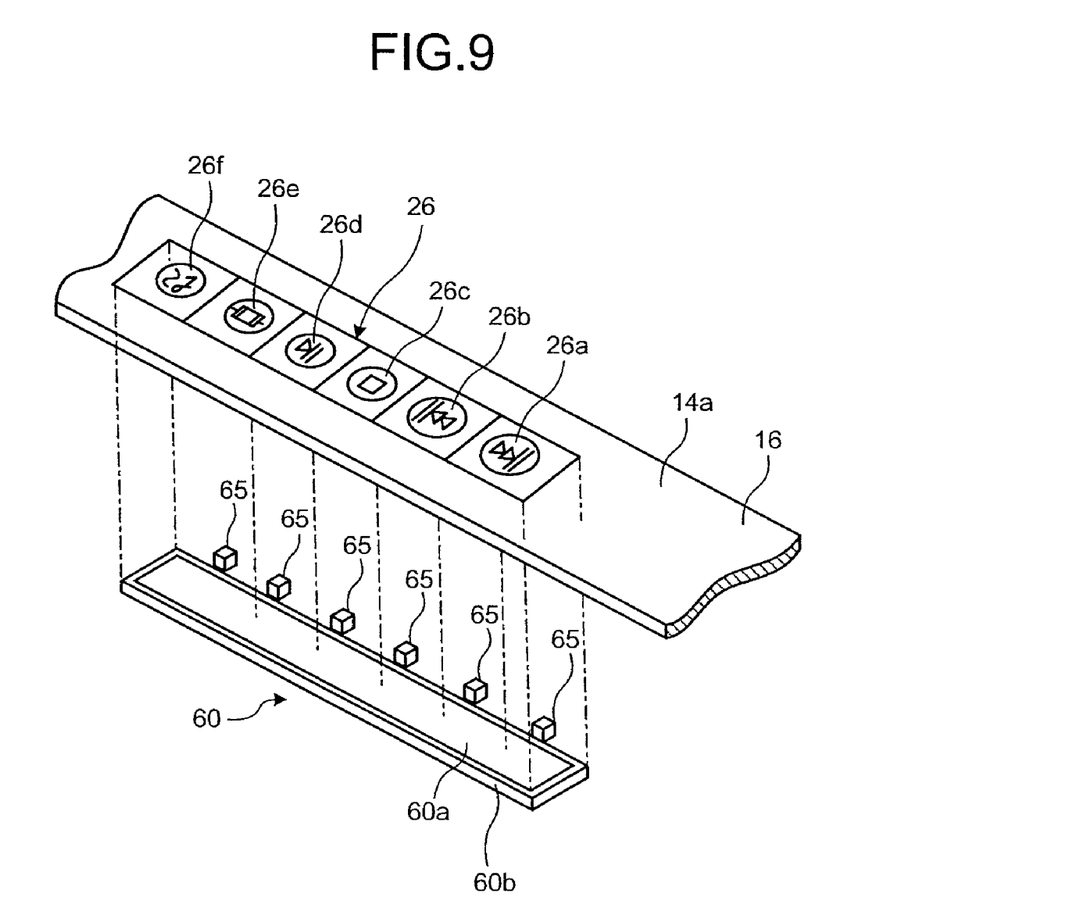
FIG. 9 is an exemplary exploded perspective view of an operation area and around the area according to a second embodiment of the invention.
Figure 10:
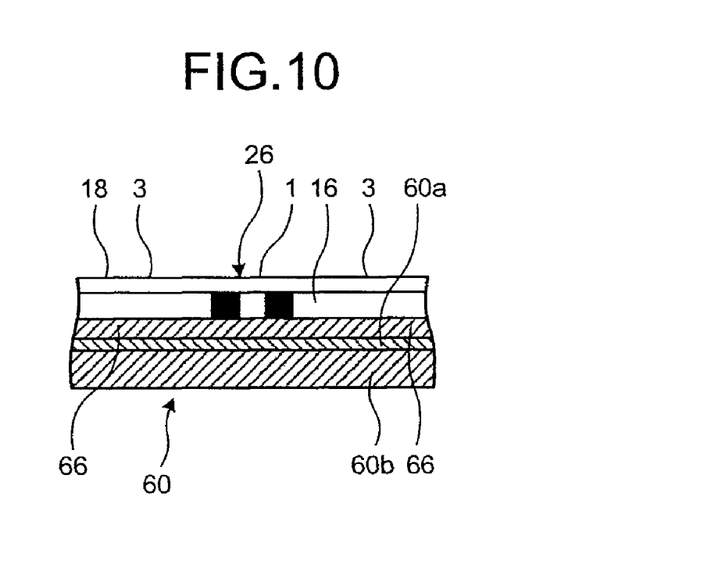
FIG. 10 is an exemplary cross-sectional view of a stop button in the second embodiment.
Figure 11:
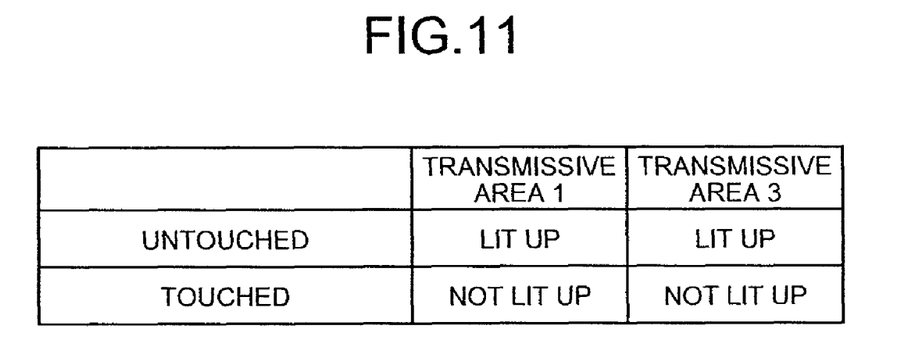
FIG. 11 is an exemplary schematic diagram of a light control table in the second embodiment.

With reference to FIGS. 9 to 11, a second embodiment of the invention will be described. Constituent elements corresponding to those of the first embodiment are designated by the same reference numerals, and their description will not be repeated.

In the first embodiment, the LEDs 64 are turned on/off to control the lighting up of the transmissive area 1, while the LEDs 65 are turned on/off to control the lighting up of the transmissive area 3. In the second embodiment, a set of LEDs is turned on/off to control the lighting up of both the transmissive areas 1 and 3 differently from the first embodiment.

FIG. 9 is an exploded perspective view of the operation area 26 of the second embodiment and the surrounding thereof. As illustrated in FIG. 9, according to the second embodiment, only the LEDs 65 are provided as common light sauces, and the holes 62 and the LEDs 64 in the holes 62 as previously described in the first embodiment are not present.

Further, as illustrated in FIG. 10, the light guide plate 66 is arranged at a position facing the LEDs 65 between the cover 16 and the input sheet 60a. With this configuration, the LEDs 65 emit light to the transmissive area 1 (i.e., the mark) and the transmissive area 3 of the operation buttons 26a to 26f from the inside of the cover 16 through the light guide plate 66.

For the operation area 26 configured as above, whether to turn on/off the LEDs 65 is determined based on a light control table as illustrated in FIG. 11. In the example of FIG. 11, when the operation buttons 26a to 26f are not touched, the LEDs 65 are controlled so that the transmissive area 1 (i.e., the mark) and the transmissive area 3 of all the operation buttons 26a to 26f are lit up. When any one of the operation buttons 26a to 26f is touched, the LEDs 65 are controlled so that the transmissive area 1 (i.e., the mark) and the transmissive area 3 of the operation button is not lit up.

In this manner, the transmissive area 3 of each operation button functions as an indicator indicating whether the operation button is touched. Accordingly, even if the transmissive area 1 (i.e., the mark) of the operation buttons 26a to 26f is covered by an operation tool such as a finger of the user, a touch on each operation button can be visually recognized. This improves the operability and convenience.

As described above, according to the second embodiment, at least one operation button (the operation buttons 26a to 26f) is arranged in the operation area 26 provided outside the housing 14. Each of the operation buttons 26a to 26f comprises the transmissive area 1 and the transmissive area 3. The transmissive area 1 corresponds to a mark which is a design indicating the operation content or function of the operation button. The transmissive area 3 is arranged in a position that is not covered by an operation tool with which the user operates the transmissive area 1, and indicates the state of operation by the user. The transmissive areas 1 and 3 are made of a light transmissive material and are located on the surface of the cover 16. According to a variation in electrostatic capacitance detected by the touch sensor 60, a light source device (the LEDs 65) is turned on/off to control the lighting up of the transmissive areas 1 and 3. In other words, even if the transmissive area 1 is covered by a fingertip of the user and the user cannot determine whether the transmissive area 1 is lit up, the user can determine the operation state through the transmissive area 3 arranged in a position that is not covered by the finger of the user with which the user operates the transmissive area 1. That is, according to a variation in electrostatic capacitance detected by the touch sensor 60, the light source device (the LEDs 65) is turned on/off to control the lighting up of the transmissive area 3. Thus, the user can visually recognize the operation state. This improves the operability and convenience. Moreover, only the LEDs 65 are used as a light source device, which simplifies the configuration of the electronic device. Therefore, cost reduction can be achieved.

While the electronic device of the first and second embodiments is described above as a portable computer, this is by way of example and not of limitation. The electronic device may be of any type, such as a mobile phone and a remote controller.

The various modules of the systems described herein can be implemented as software applications, hardware and/or software modules, or components on one or more computers, such as servers. While the various modules are illustrated separately, they may share some or all of the same underlying logic or code.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An electronic device comprising:
   a first light source;
   a second light source arranged at a position different from that of the first light source;
   a first transmissive portion configured to be transparent to light from the first light source, and configured to correspond to a sign indicative of content of an operation;
   a second transmissive portion arranged at a position different from that of the first transmissive portion, and configured to be transparent to light from the second light source;
   a non-transmissive portion arranged between the first transmissive portion and the second transmissive portion, and configured to be opaque to the light from the first and the second light sources;
   a detector configured to detect electrostatic capacitance at the first transmissive portion; and
   a controller configured to turn either on or off the first light source and the second light source in accordance with a pattern, the pattern being that of turning on and off of the first transmissive portion and the second transmissive portion associated with a pattern of change of a state corresponding to a change in the electrostatic capacitance detected by the detector,
   wherein, when the detector detects the change of the state at the first transmissive portion corresponding to the change in the electrostatic capacitance while the first light source is emitting the light, the controller controls the second light source to emit the light and controls the first light source to change a light emission mode thereof.

2. The electronic device of claim 1, wherein the first and the second transmissive portions are arranged on an exterior face of a housing.

3. The electronic device of claim 2, wherein the detector is arranged on an interior face of the housing and at a position facing the first transmissive portion.

4. The electronic device of claim 1, wherein the first transmissive portion is arranged at a position to be covered by an operating body when an operator operates the electronic device.

5. An electronic device comprising:
   a first light source;
   a first transmissive portion configured to be transparent to light from the first light source;
   a second light source arranged at a position different from that of the first light source;
   a second transmissive portion arranged at a position different from the first transmissive portion, and configured to be transparent to light from the second light source;
   a detector configured to detect operation at the first transmissive portion; and
   a controller configured to control the second light source to emit the light and the first light source to change a light emission mode thereof, when the detector detects the operation at the first transmissive portion while the first light source is emitting the light.

6. The electronic device of claim 5, wherein the first transmissive portion is a mark corresponding to a sign indicative of content of an operation.

7. The electronic device of claim 5, further comprising a non-transmissive portion arranged between the first transmissive portion and the second transmissive portion, and configured to be opaque to the light from the first and the second light sources.

8. The electronic device of claim 5, wherein the detector detects the operation in accordance with a change in electrostatic capacitance at the first transmissive portion.

9. The electronic device of claim 8, wherein the controller is configured to turn either on or off the first light source and the second light source in accordance with a pattern, the pattern being that of turning on and off of the first transmissive portion and the second transmissive portion associated with a pattern of change of a state corresponding to a change in the electrostatic capacitance detected by the detector.

10. The electronic device of claim 6, wherein the mark is arranged at a position to be covered by an operating body when an operator operates the electronic device.

* * * * *